US007459996B2

(12) United States Patent
Lin

(10) Patent No.: US 7,459,996 B2
(45) Date of Patent: Dec. 2, 2008

(54) STABLE FILTER AND METHOD FOR FORMING THE SAME

(75) Inventor: Chia-Ho Lin, Taipei Hsien (TW)

(73) Assignee: High & Low Electronics Co., Ltd., Xindian, Taipei County (TW)

( * ) Notice: Subject to any disclaimer, the term of this patent is extended or adjusted under 35 U.S.C. 154(b) by 253 days.

(21) Appl. No.: 11/324,390

(22) Filed: Jan. 4, 2006

(65) Prior Publication Data

US 2006/0103490 A1 May 18, 2006

Related U.S. Application Data

(63) Continuation-in-part of application No. 10/735,922, filed on Dec. 16, 2003, now abandoned.

(51) Int. Cl.
*H03H 7/00* (2006.01)

(52) U.S. Cl. ...................................... 333/181; 333/185

(58) Field of Classification Search ................... 333/12, 333/181, 185; 174/36, 660, 661
See application file for complete search history.

(56) References Cited

U.S. PATENT DOCUMENTS

| | | | | |
|---|---|---|---|---|
| 4,557,177 A * | 12/1985 | Cheney | ...................... | 89/1.51 |
| 4,761,623 A * | 8/1988 | Schneider | ................... | 333/167 |
| 4,970,476 A * | 11/1990 | Kitagawa | ..................... | 333/12 |
| 5,340,944 A * | 8/1994 | Wang | ......................... | 174/350 |
| 6,444,902 B1 * | 9/2002 | Tsao et al. | .................... | 174/36 |

* cited by examiner

*Primary Examiner*—Seungsook Ham

(57) ABSTRACT

A filter comprises a receptacle including a positive terminal pin, a negative terminal pin and a ground terminal pin; a filter box installed at one side of the receptacle; the filter box being installed with electric elements; a filter cover serving to seal theses electric elements within the filter box; a ground terminal pin being installed at another side of the filter box; the electric elements and grounding terminal being connected to the positive terminal pin, negative terminal pin and ground terminal pin so as to form a filtering circuit; a positive electrode of the filtering circuit being welded with a positive conductive wire and a negative conductive wire; a metal casing having a receiving groove for being engaged to the filter box and the receptacle; and an isolating cover being engaged to the metal casing; thereby the teeth piercing into a periphery of the isolating cover.

4 Claims, 7 Drawing Sheets

STABLE FILTER AND METHOD FOR FORMING THE SAME

The present invention is a continuation in part (CIP) of U.S. patent Ser. No. 10/735,922 filed Dec. 16, 2003 assigned to an applicant of the present invention now abandoned. Thus the content of U.S. patent Ser. No. 10/735,922 is incorporated into the present invention as a part of specification of the present invention.

FIELD OF THE INVENTION

The present invention relates to filers, and particularly to a filter which is stable and occupies a smaller space.

BACKGROUND OF THE INVENTION

Referring to FIG. 7, a prior art filter is illustrated. The prior art filter has a filter box 70 at one side of a receptacle 7. The filter box 2 is installed with a resistor 71, an inductor coil 72, Y capacitors 73, and other electronic elements. A cover 700 serves to seal the electronic elements within the filter box 70. A positive electrode 74, a negative electrode 75 and a ground sheet 76 are protruded from one side of the filter box 70. A metal casing 8 serves to enclose one side of the receptacle 7 and the filter box 70 so that the positive electrode 74, the negative electrode 75 and the ground sheet 76 protrude out of the metal casing 8.

However, in this prior art, the positive electrode 74, the negative electrode 75 and the ground sheet 76 protruding out of the metal casing 8 are welded to a circuit board with a larger space so as to affect the installation of other elements of the circuit board. Furthermore, if two ends of a conductive wire is directly connected to the circuit board, the positive electrode 74, the negative electrode 75 and the ground sheet 76 so as to improve the problem of occupying a larger space in the circuit board, but the problem of electromagnetic interference induces. As a result, the filter will be unstable.

SUMMARY OF THE INVENTION

Accordingly, the primary object of the present invention is to provide a filter which is stable and occupies a smaller space.

To achieve above objects, the present invention provides a filter which comprises a receptacle including a positive terminal pin, a negative terminal pin and a ground terminal pin; a filter box installed at one side of the receptacle; the filter box being installed with electric elements; a filter cover serving to seal theses electric elements within the filter box; a ground terminal pin being installed at another side of the filter box; the electric elements and grounding terminal being connected to the positive terminal pin, negative terminal pin and ground terminal pin so as to form a filtering circuit; a positive electrode of the filtering circuit being welded with a positive conductive wire and a negative conductive wire; a metal casing having a receiving groove for being engaged to the filter box and the receptacle; a bottom of the receiving groove being formed with a terminal through hole and a conductive wire through hole; the grounding terminal passing through the terminal through hole to extend out; a periphery of the conductive wire through hole being formed with a recess; an edge of the conductive wire through hole being formed with a plurality of inward inclined teeth; an isolating cover being a long strip and having a net for isolating electromagnetic waves; one end of the isolating cover 4 passing out of the conductive wire through hole of the metal casing and another end thereof being formed with an expanding opening section; the expanding opening section being punched into the recess of the metal casing; the isolating cover being engaged to the metal casing; thereby the teeth piercing into a periphery of the isolating cover; the positive conductive wire and negative conductive wire receiving within the isolating cover and extend out from the isolating cover; and an isolating rubber cover sleeving around the isolating cover.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
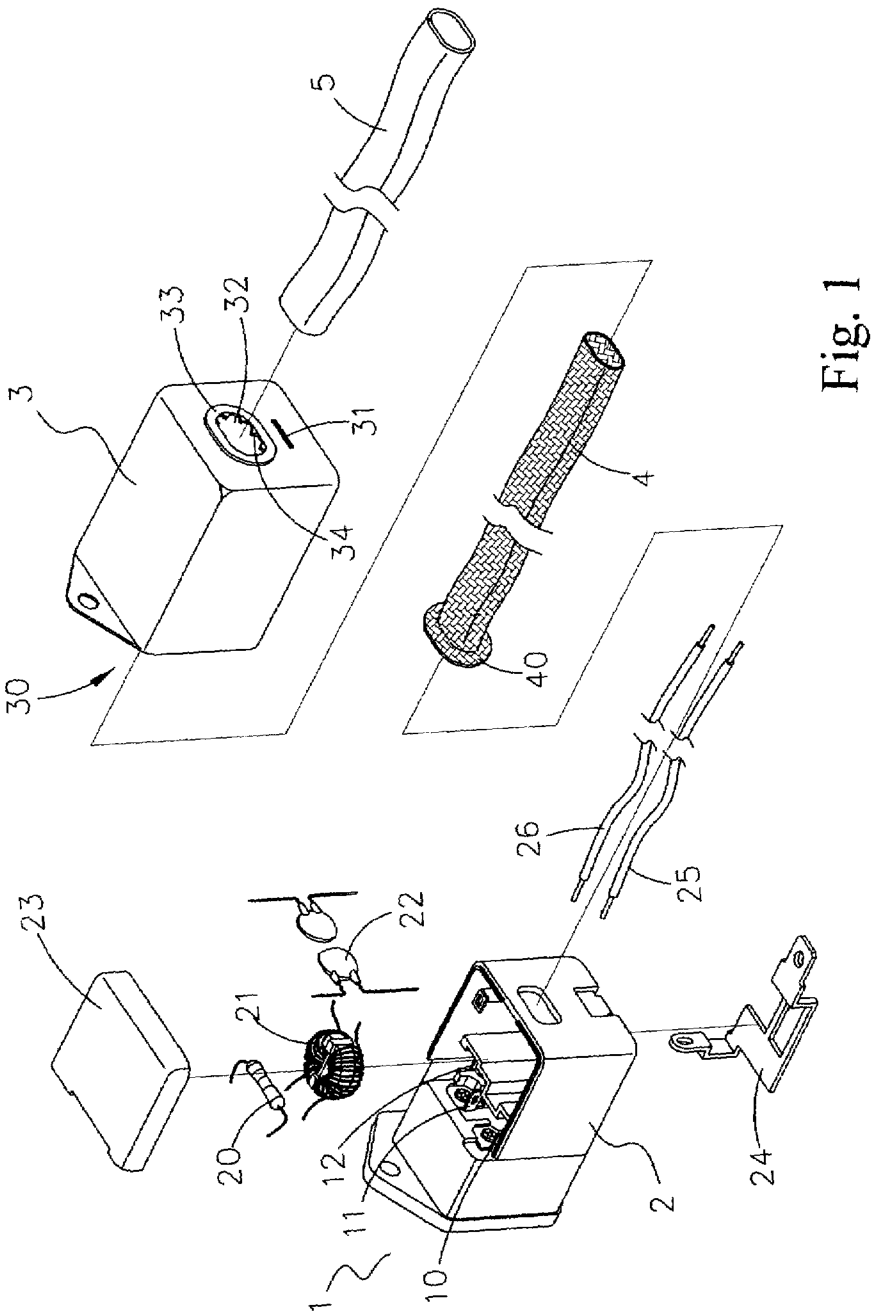
FIG. 1 is an exploded perspective view of the filter of the present invention.
Figure 2:
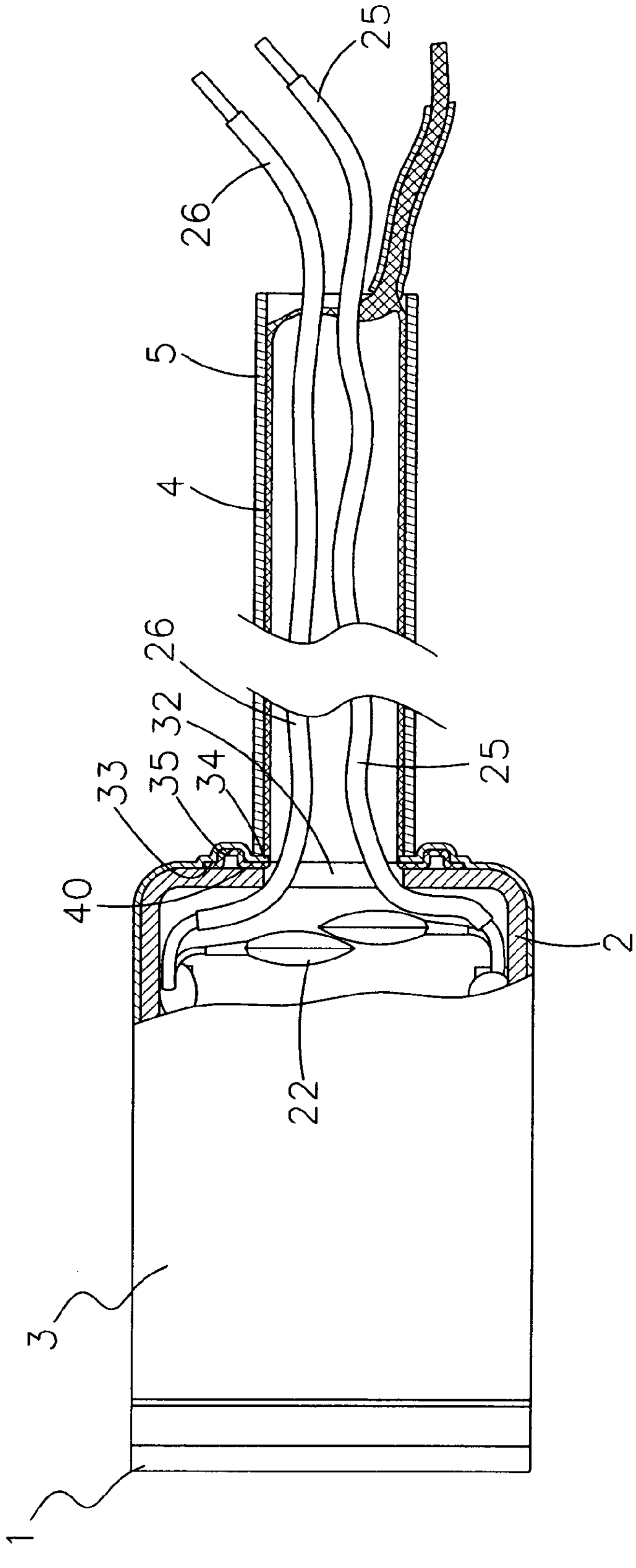
FIG. 2 is a partial cross sectional view of the filter of the present invention.

Referring to FIGS. 1 and 2, the tilter of the present invention is illustrated. The present invention has the following elements.

A receptacle 1 includes a positive terminal pin 10, a negative terminal pin 11 and a ground terminal pin 12.

A filter box 2 is installed at one side of the receptacle 1. The filter box 2 is installed with a resistor 20, an inductor coil 21, two Y capacitors 22, and other electric elements. A filter cover 23 serves to seal theses electric elements within the filter box 2. A ground terminal 24 is installed at another side of the filter box 2. The resistor 20, inductor coil 21, two Y capacitors 22 and grounding terminal 24 are connected to the positive terminal pin 10, negative terminal pin 11 and ground terminal pin 12 so as to form a filtering circuit. A positive electrode and a negative electrode of the filtering circuit is welded with a positive conductive wire 25 and a negative conductive wire 26.

A metal casing 3 has a receiving groove 30 for being engaged to the filter box 2 and the receptacle 1. A bottom of the receiving groove 30 is formed with a terminal through hole 31 and a conductive wire through hole 32. The grounding terminal 24 passes through the terminal through hole 31 to extend out. A periphery of the conductive wire through hole 32 is formed with a recess 33. An edge of the conductive wire through hole 32 is formed with a plurality of inward inclined teeth 34.

An isolating cover 4 is a long strip and has a net for isolating electromagnetic waves. One end of the isolating cover 4 passes out of the conductive wire through hole 32 of the metal casing 3 and another end thereof is formed with an expanding opening section 40. The expanding opening section 40 is punched into the recess 33 of the metal casing 3. An inner side of the recess 33 is formed with a plurality of embedding grooves 35. A part of the expanding opening section 40 fills into the embedding grooves 35 so that the isolating cover 4 is engaged to the metal casing 3. Thereby the teeth 34 pierce into a periphery of the isolating cover 4. The expanding opening section 40 is welded to the metal casing 3. The positive conductive wire 25 and negative conductive wire 26 receive within the isolating cover 4 and extend out from the isolating cover 4.

An isolating rubber cover 5 sleeves around the isolating cover 4.

Referring to FIGS. 3 to 6, the method for manufacturing the filter of the present invention will be described herein.

Figure 3:
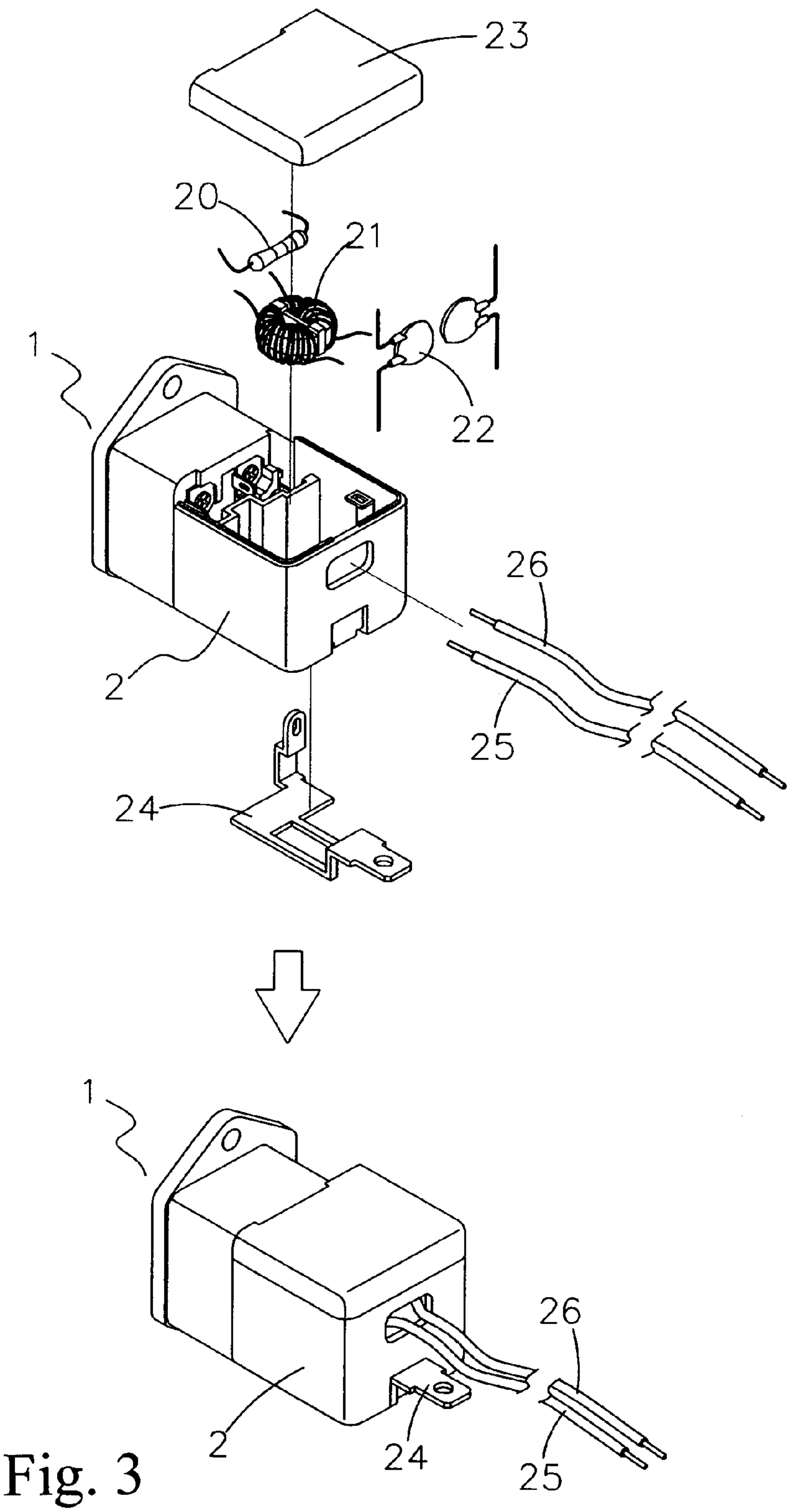
FIG. 3 is an assembled view of the receptacle and filter box of the present invention.

Firstly, a resistor 20, an inductor coil 21, two Y capacitors 22, and other electric elements are welded to a filter box 2 which is installed at one side of a receptacle 1 so as to form a filtering circuit. One end of a positive conductive wire 25 and one end of a negative conductive wire 26 are welded to a positive electrode and a negative electrode of the filtering circuit, as shown in FIG. 3.

Figure 4:
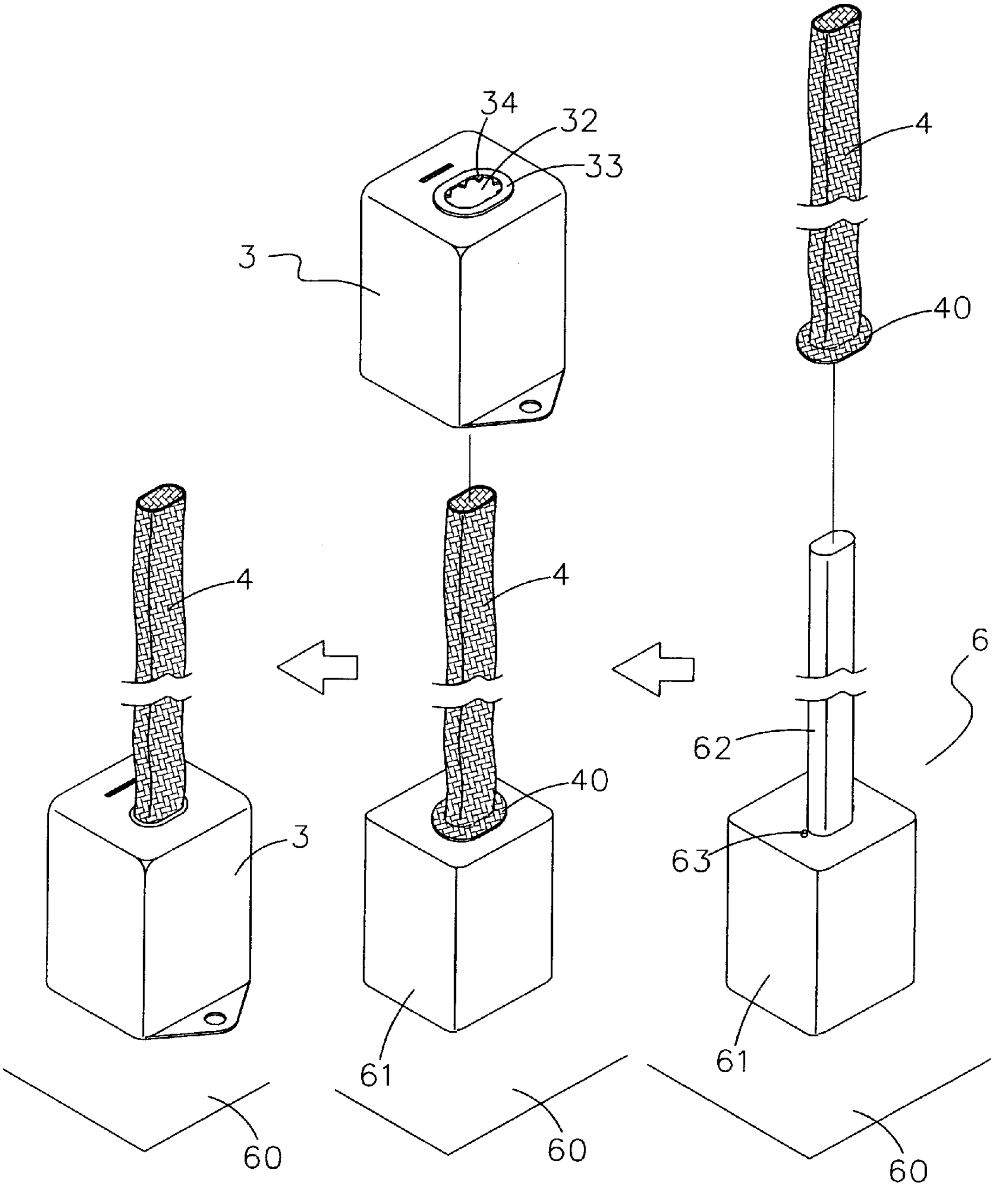
FIG. 4 is an assembled view about the metal casing and the isolating cover of the present invention.
Figure 5:
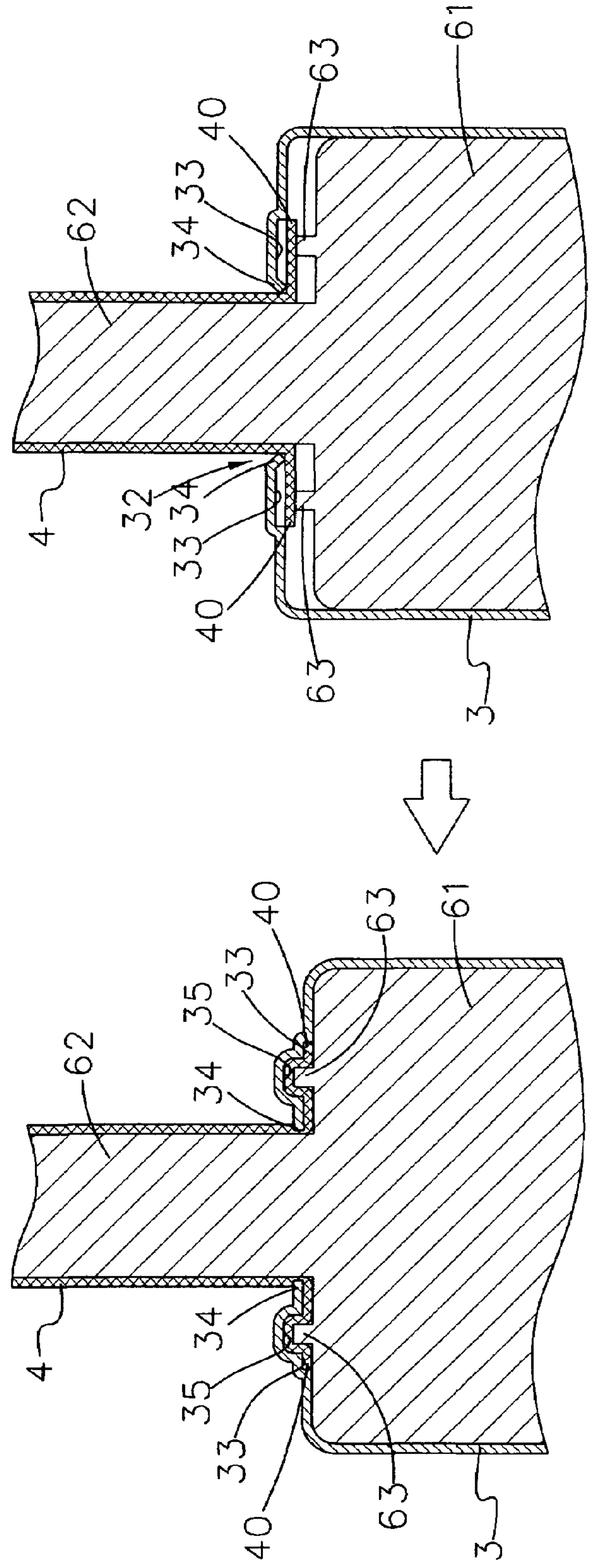
FIG. 5 is a cross sectional view showing the operation of the metal casing and the isolating cover of the present invention.

Then, a terminal through hole 31 and a conductive wire through hole 32 are punched in a bottom of a metal casing 3. A periphery of the conductive wire through hole 32 is punched inwards to be formed with a recess 33. An edge of the conductive wire through hole 32 is punched with a plurality of inwards inclined teeth 34, as shown in FIGS. 4 and 5.

Next, an isolating cover 4 and a metal casing 3 are installed to a mold 6 sequentially. The mold 6 punches the bottom of the metal casing 3. Then, the isolating cover 4 is welded to the metal casing 3, as shown in FIG. 4. The mold 6 is formed by a seat 60 and a weight 61 on the seat 60. A bar 62 is installed on the weight 61. A periphery of the bar 62 is installed with a plurality of projections 63. In the punching process of the isolating cover 4 and the metal casing 3, one end of the isolating cover 4 is expanded as an expanding opening section 40. Then the expanding opening section 40 is sleeved to the weight 62. Then the mold 6 punches to the bottom of the metal casing 3. The expanding opening section 40 will embed into the recess 33 so that the bottom of the metal casing 3 is flushed to be flat. The plurality of projections 63 will punch the inner side of the recess 33 to be formed with a plurality of embedding grooves 35. Furthermore, a part of the expanding opening section 40 will fill into the embedding grooves 35 so that the isolating cover 4 is embedded into the metal casing 3. Moreover, the teeth 34 pierce into the periphery of the isolating cover 4.

Figure 6:
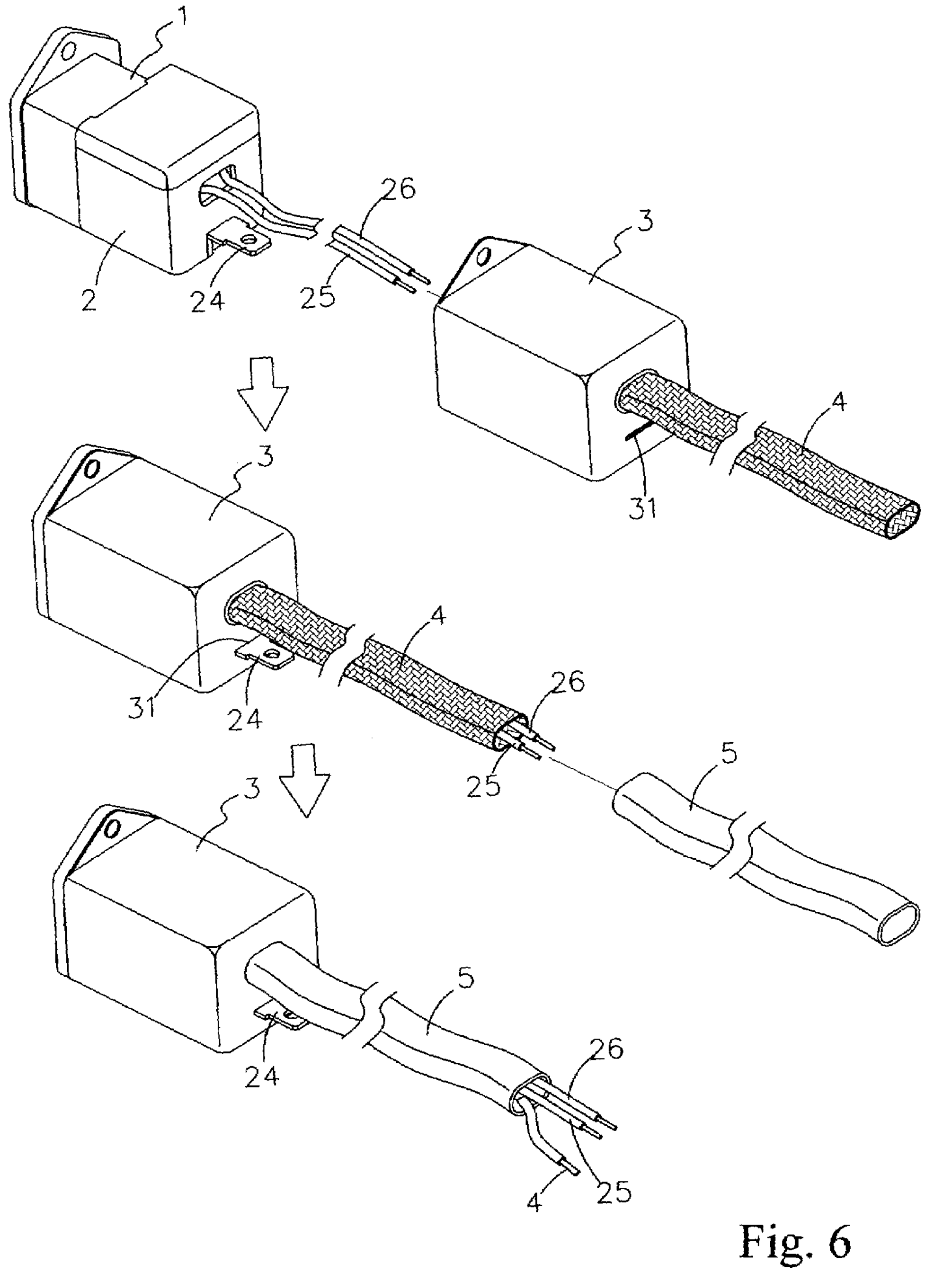
FIG. 6 is an assembled view about the assembly of the receptacle and the metal casing according to the present invention.
Figure 7:
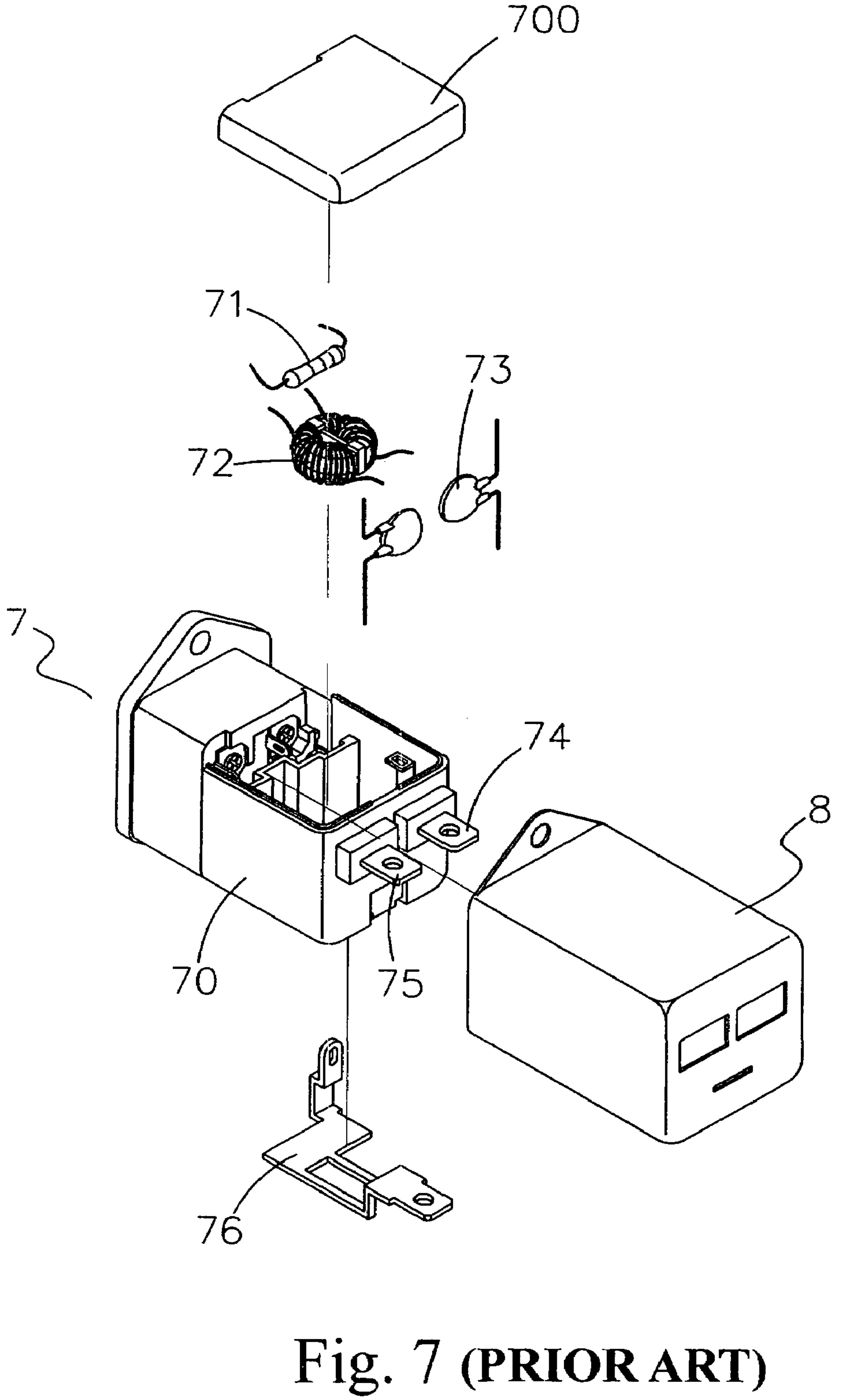
Fig. 7 (PRIOR ART)
FIG. 7 is an exploded perspective view of the filter of the present invention.

Then, the positive conductive wire 25 and negative conductive wire 26 enter into the conductive wire through hole 32 of the metal casing 3 and then enter into the isolating cover 4 and then protrude out of the isolating cover 4. Furthermore, the filter box 2 is enclosed by the metal casing 3. Furthermore, one side of the receptacle 1 is sleeved into the metal casing 3 and the grounding terminal 24 enters into the terminal through hole 31 and protrudes out of the terminal through hole 31, as shown in FIG. 6.

Then, an isolating rubber cover 5 encloses the isolating cover 4.

Finally, an end of the isolating cover 4 is curled as a wire and protrudes out of the isolating rubber cover 5. Thus a filter with a conductive wire is formed.

In the present invention, the positive conductive wire 25 and negative conductive wire 26 are completely enclosed by the isolating cover 4. The isolating cover 4 has the effect of isolating electromagnetic waves. Furthermore, the use of the filter is extended by the extension of the positive conductive wire 25 and negative conductive wire 26, but the filter only occupies a small space. Furthermore, the positive conductive wire 25 and negative conductive wire 26 are enclosed by the isolating cover 4 without being interfered by electromagnetic waves of external electronic elements. Moreover, the filter has a preferred filtering effect.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A filter comprising:

a receptacle including a positive terminal pin, a negative terminal pin and a ground terminal pin;

a filter box installed at one side of the receptacle; the filter box being installed with electric elements; a filter cover serving to seal the electric elements within the filter box; a ground terminal being installed at another side of the filter box; the electric elements and the grounding terminal being connected to the positive terminal pin, negative terminal pin and ground terminal pin so as to form a filtering circuit; a positive electrode and a negative electrode of the filtering circuit being welded with a positive conductive wire and a negative conductive wire;

a metal casing having a receiving groove for being engaged to the filter box and the receptacle; a bottom of the receiving groove being formed with a terminal through hole and a conductive wire through hole; the grounding terminal passing through the terminal through hole to extend out; a periphery of the conductive wire through hole being formed with a recess; an edge of the conductive wire through hole being formed with a plurality of inward inclined teeth;

an isolating cover being a long strip and having a net for isolating electromagnetic waves; one end of the isolating cover passing out of the conductive wire through hole of the metal casing and another end thereof being formed with an expanding opening section; the expanding opening section being punched into the recess of the metal casing; the isolating cover being engaged to the metal casing; thereby the teeth piercing into a periphery of the isolating cover; the positive conductive wire and negative conductive wire receiving within the isolating cover and extend out from the isolating cover; and an isolating rubber cover enclosing around the isolating cover.

2. The filter as claimed in claim 1, wherein the electric elements includes a resistor, an inductor coil, and two Y capacitors.

3. The filter as claimed in claim 1, wherein the isolating cover is welded to the metal casing.

4. The filter as claimed in claim 1, wherein an inner side of the recess is formed with a plurality of embedding grooves; and a part of the expanding opening section filling into the embedding grooves so that the isolating cover is engaged to the metal casing.

* * * * *